(12) United States Patent
Nakajima et al.

(10) Patent No.: US 6,417,704 B1
(45) Date of Patent: Jul. 9, 2002

(54) POWER-ON CIRCUIT AND RESETTING METHOD

(75) Inventors: Yuji Nakajima; Tadahiko Sugibayashi, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/459,015

(22) Filed: Dec. 10, 1999

(30) Foreign Application Priority Data

Dec. 11, 1998 (JP) .......................... 10-352753

(51) Int. Cl.[7] ................................. H03L 7/00
(52) U.S. Cl. ................. 327/143; 327/170; 327/175; 327/176
(58) Field of Search .............................. 327/142, 143, 327/170, 172, 173, 174, 175, 176

(56) References Cited

U.S. PATENT DOCUMENTS 5,517,144 A  *  5/1996  Nakashima .................. 327/198
5,771,196 A  *  6/1998  Yang ........................... 356/207
5,804,996 A  *  9/1998  Verhaeghe et al. ............ 327/77
5,936,443 A  *  8/1999  Yasuda et al. ............... 327/143
6,107,847 A  *  8/2000  Johnson et al. .............. 327/143

FOREIGN PATENT DOCUMENTS

JP            6-290586         10/1994

* cited by examiner

Primary Examiner—Terry D. Cunningham
Assistant Examiner—Quan Tra
(74) Attorney, Agent, or Firm—Scully, Scott, Murphy & Presser (57) ABSTRACT

A power-on circuit and a resetting method by which resetting of a circuit through which flows direct current upon resetting can be achieved stable state without causing a large current to flow in the circuit. For resetting a circuit through which flows the direct current at the time of resetting, such as a circuit for resetting a fuse on power source on, there is provided a power-on circuit generating a one-shot signal on power source on, in which two or more one-shot signals are provided and resetting is carried out by at least two partial operations to achieve stable resetting without flowing a larger current.

8 Claims, 7 Drawing Sheets

POWER-ON CIRCUIT AND RESETTING METHOD

FIELD OF THE INVENTION

This invention relates to a semiconductor device and, more particularly, to a power-on circuit in which resetting of a circuit designed to allow direct current to flow upon resetting is performed in a stable state without allowing a large current to flow in this circuit.

BACKGROUND OF THE INVENTION

Figure 7:
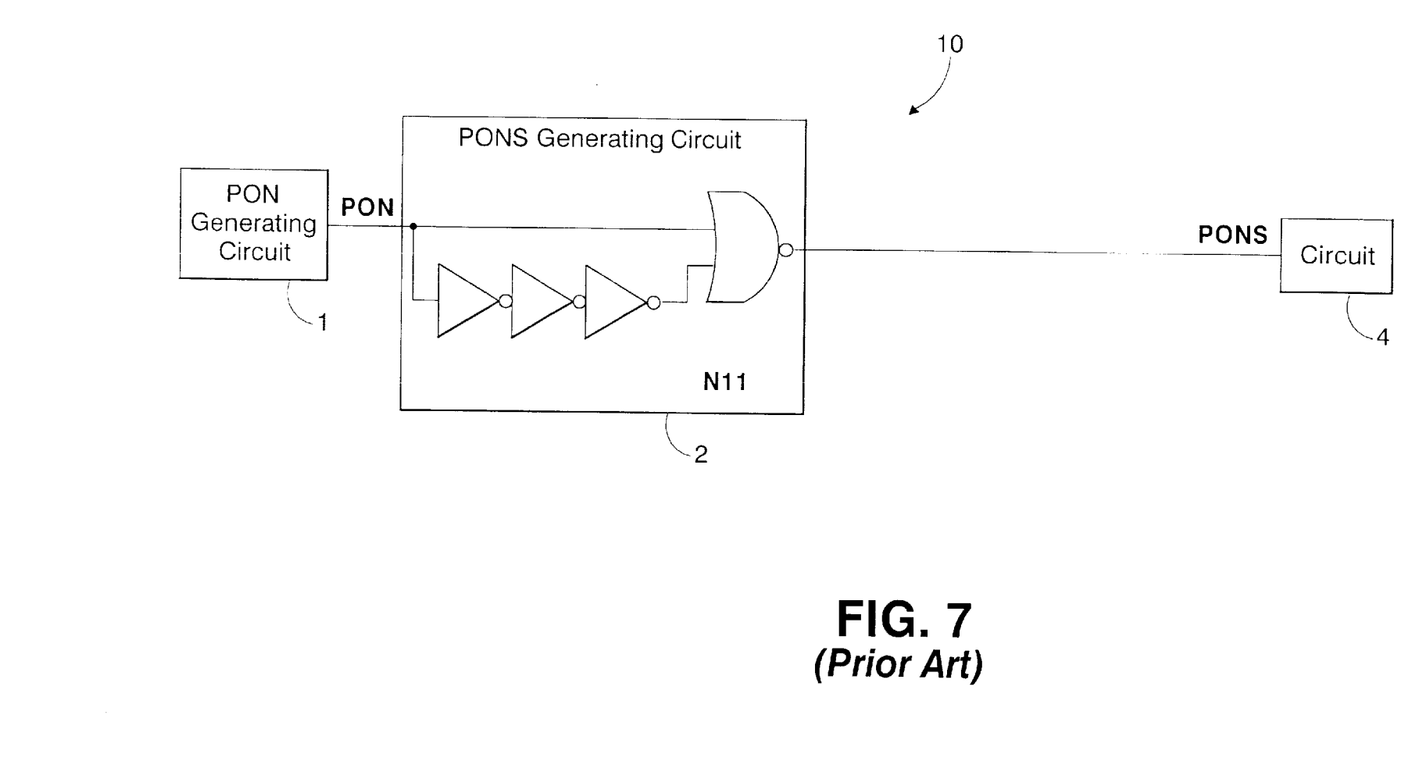
FIG. 7 is a circuit diagram for illustrating a power-on circuit of a conventional technique.

Among the conventional techniques for resetting a circuit designed to allow the direct current to flow at the time of resetting in stable state, without permitting a large current to flow therein, there is such a technique disclosed in, for example, the JP Patent Kokai JP-A-6-290586. The conventional technique, disclosed in this prior art, is directed to a semiconductor memory device adapted to be used without a dummy cycle on power source on, and includes a power on reset circuit responsive to power source on to send a reset signal to an internal circuit, a ring oscillator outputting pulses of a pre-set period during an initial pause period responsive to power source on and, logic sum means for taking a logical sum of the pulse of the pre-set period and an external/RAS signal to send the resulting sum signal to an internal circuit. There is also disclosed a conventional power-on circuit shown in FIG. 7. This power-on circuit includes a PON generating circuit 1 for generating and outputting a power-on signal PON representing a voltage increasing state as from power source on and a PONS generating circuit 2 for generating one-shot signals PONS from the power source on signal PON generated and output by the PON generating circuit 1. This conventional power-on circuit effects circuit resetting solely by one-shot signals PONS.

SUMMARY OF THE DISCLOSURE

However, the following problem has been encountered in the course of investigations toward the present invention. Namely, the conventional technique resets the entire circuit adapted to reset at indefinite nodal points (including, for example, a circuit reset on power source on, such as a fuse) by the one-shot signals. Thus, a large current flows in the circuit such that stable resetting cannot be realized caused by, for example, power source voltage drop.

It is therefore an object of the present invention to provide a power-on circuit and a resetting method whereby resetting can be achieved reliably without allowing a large current to flow in a circuit flown through by the direct current at the time of resetting.

Other objects of the present invention will become apparent in the entire disclosure.

According to a first aspect of the present application, there is provided a power-on circuit in which resetting of a circuit designed to allow direct current to flow at the time of resetting is performed in stable state without allowing a large current to flow in this circuit. The power-on circuit comprises a PON generating circuit generating and outputting a power-on signal representing an increasing voltage state following power source on, and delay pulse generating unit generating and outputting a plurality of one-shot pulses having time delay setting such that time delay becomes sequentially larger with reference to a waveform of the power-on signal. Resetting is performed for the circuit designed to allow the direct current to flow at the time of resetting using the one-shot pulses sequentially in an order of the increasing delay time.

According to a second aspect of the present application, there is provided in a power-on circuit wherein a plurality of one-shot pulses are generated at the time of power on so as to be used for circuit resetting, and wherein the circuit is reset by two or more partial resetting operations using the plural one-shot pulses.

According to a third aspect of the present application, there is provided a power-on circuit in which resetting of a circuit designed to allow a direct current at the time of resetting is performed in stable state without allowing a large current to flow in this circuit; the power-on circuit comprising a PON generating circuit generating and outputting a power-on signal representing an increasing voltage state following power source on, a PONS generating circuit generating first one-shot pulses based on a waveform of the power-on signal and a PONT generating circuit generating second one-shot pulses having a timing delayed by a pre-set time from the first one-shot pulses. The circuit designed to allow the direct current to flow at the time of resetting is once reset using the first one-shot pulses and the circuit thus reset once is subsequently reset using the second one-shot pulses.

According to a fourth aspect of the present application, there is provided in a power-on circuit in which resetting of a circuit designed to allow the direct current to flow at the time of resetting is performed in stable state without allowing a large current to flow in this circuit; the power-on circuit comprising a PON generating circuit generating and outputting a power-on signal representing an increasing voltage state following power source on, a ring oscillator arranged downstream of the PON generating circuit, a counter arranged downstream of the ring oscillator and a selector arranged downstream of the ring oscillator in parallel with the counter. For generating a plurality of one-shot pulses at the time of power on for use for circuit resetting, the ring oscillator generating the plural one-shot pulses, the counter and the selector are used, and the number of the pulses generated by the ring oscillator is counted and the selector distributes the one-shot pulses into n.

According to a fifth aspect of the present application, the ring oscillator is oscillated at the time of voltage increase following power source on to generate and output pulses.

According to a sixth aspect of the present application, there is provided the selector distributes the one-shot pulses into n, and wherein the distributed one-shot pulses are imparted to a plurality of the circuits to permit the circuits to be reset sequentially with offset timings.

According to a seventh aspect of the present application, there is provided a resetting method in which resetting of a circuit designed to allow the direct current to flow at the time of resetting is performed in stable state without allowing a large current to flow in this circuit; the power-on circuit comprising generating and outputting a power-on signal representing an increasing voltage state following power source on, generating and outputting a plurality of one-shot pulses having time delay setting such that time delay becomes sequentially larger with reference to a waveform of the power-on signal and resetting the circuit designed to allow the direct current to flow at the time of resetting using the one-shot pulses sequentially in an order of the increasing delay time.

According to a eighth aspect of the present application, there is provided a resetting method in which a plurality of one-shot pulses are generated at the time of power on for use for resetting a circuit designed to allow the direct current to flow upon resetting, wherein the circuit is reset by two or more partial resetting operations using the plural one-shot pulses.

According to a ninth aspect of the present application, there is provided a resetting method in which resetting of a circuit designed to allow the direct current at the time of resetting is performed in stable state without allowing the large current to flow in the circuit; the method comprising: generating and outputting a power-on signal representing an increasing voltage state following power source on, generating first one-shot pulses based on a waveform of the power-on signal and generating second one-shot pulses having a timing delayed by a pre-set time from the first one-shot pulses. The circuit designed to allow the direct current at the time of resetting is once reset using the first one-shot pulses and the circuit thus reset once is then reset using the second one-shot pulses.

According to a tenth aspect of the present application, there is provided a resetting method in which resetting of a circuit designed to allow the direct current at the time of resetting is performed in stable state without allowing a large current to flow in the circuit; the method comprising: generating and outputting a power-on signal representing an increasing voltage state following power source on, and generating and outputting ring oscillator pulses responsive to the power-on signal. In generating a plurality of one-shot pulses at the time of power on for use for resetting the circuit, the number of the ring oscillator pulses is counted and the one-shot pulses are distributed into n.

According to a eleventh aspect of the present application, the ring oscillator pulses are generated and output at the time of voltage increase following power source on.

According to a twelfth aspect of the present application, the one-shot pulses distributed into n are imparted to a plurality of the circuits to permit the circuits to be reset sequentially with offset timings.

In the following, the preferred embodiments of the present invention are described by way of illustration with reference to the drawings.

PREFERRED EMBODIMENTS OF THE INVENTION

The embodiments of the present invention, now explained, are directed to a power-on circuit which generates one-shot signals at the time of power source on, in which plural one-shot signals are provided and circuit resetting is performed by two or more partial operations to realize stable resetting without flow of a large current. The preferred embodiments of the present invention are explained in detail with reference to the drawings.

(First Embodiment)

Figure 1:
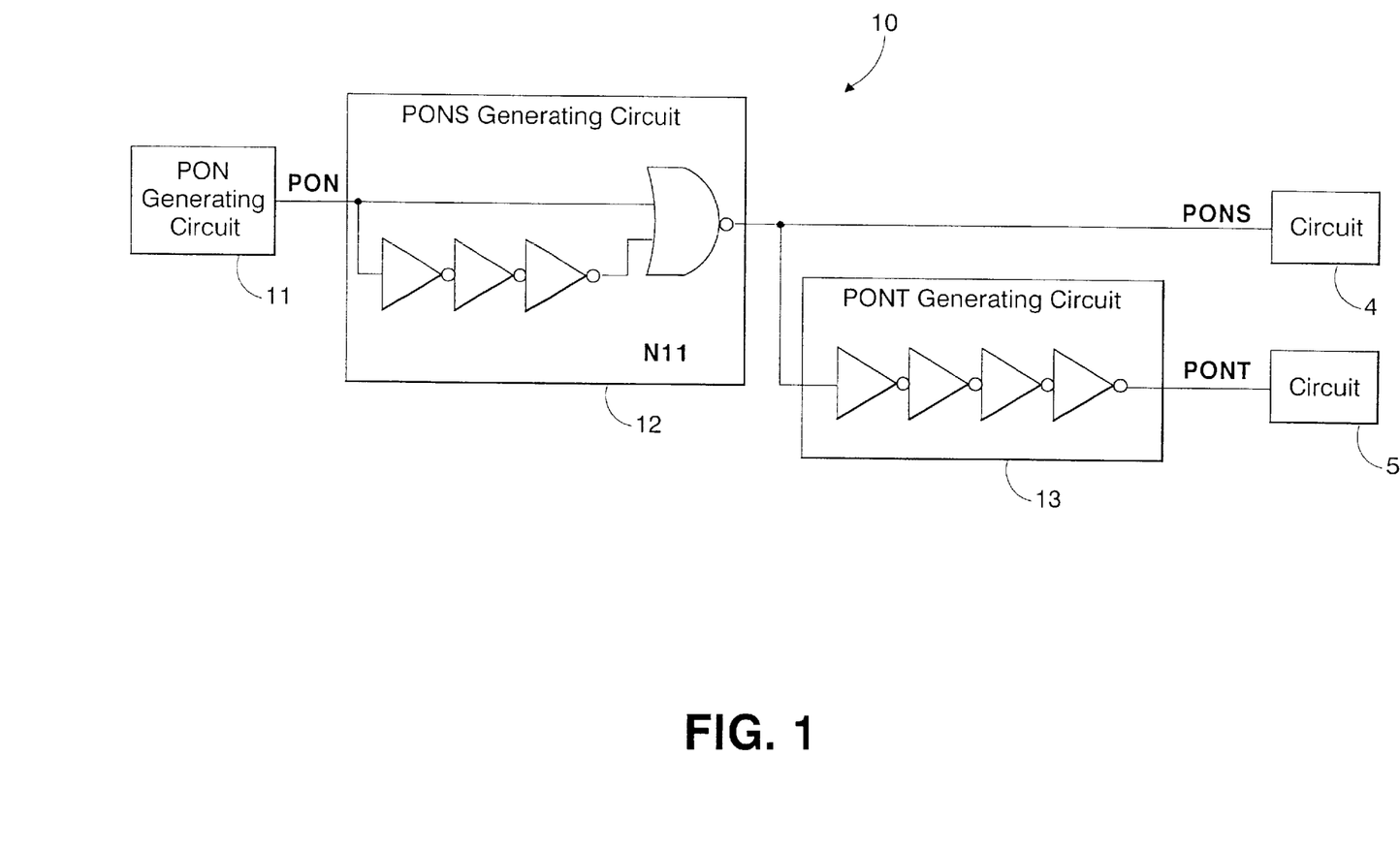
FIG. 1 is a circuit diagram for illustrating a power-on circuit according to a first embodiment of the present invention.

FIG. 1 is a circuit diagram for illustrating a first embodiment of a power-on circuit 10 according to the present invention. Referring to FIG. 1, a power-on circuit 10 of the first embodiment includes a PON generating circuit 11 for generating and outputting a power-on signal PON representing the voltage rising state following power-source-voltage-on, and a PONS generating circuit 12 for generating and outputting a one-shot pulse PONS from the power-on signal PON generated and output by the PON generating circuit 11. The power-on circuit 10 also includes a PONT generating circuit 13 for generating and outputting a one-shot pulse PONT from the one-shot pulse PONS generated and output by the PONS generating circuit 12.

Figure 2:
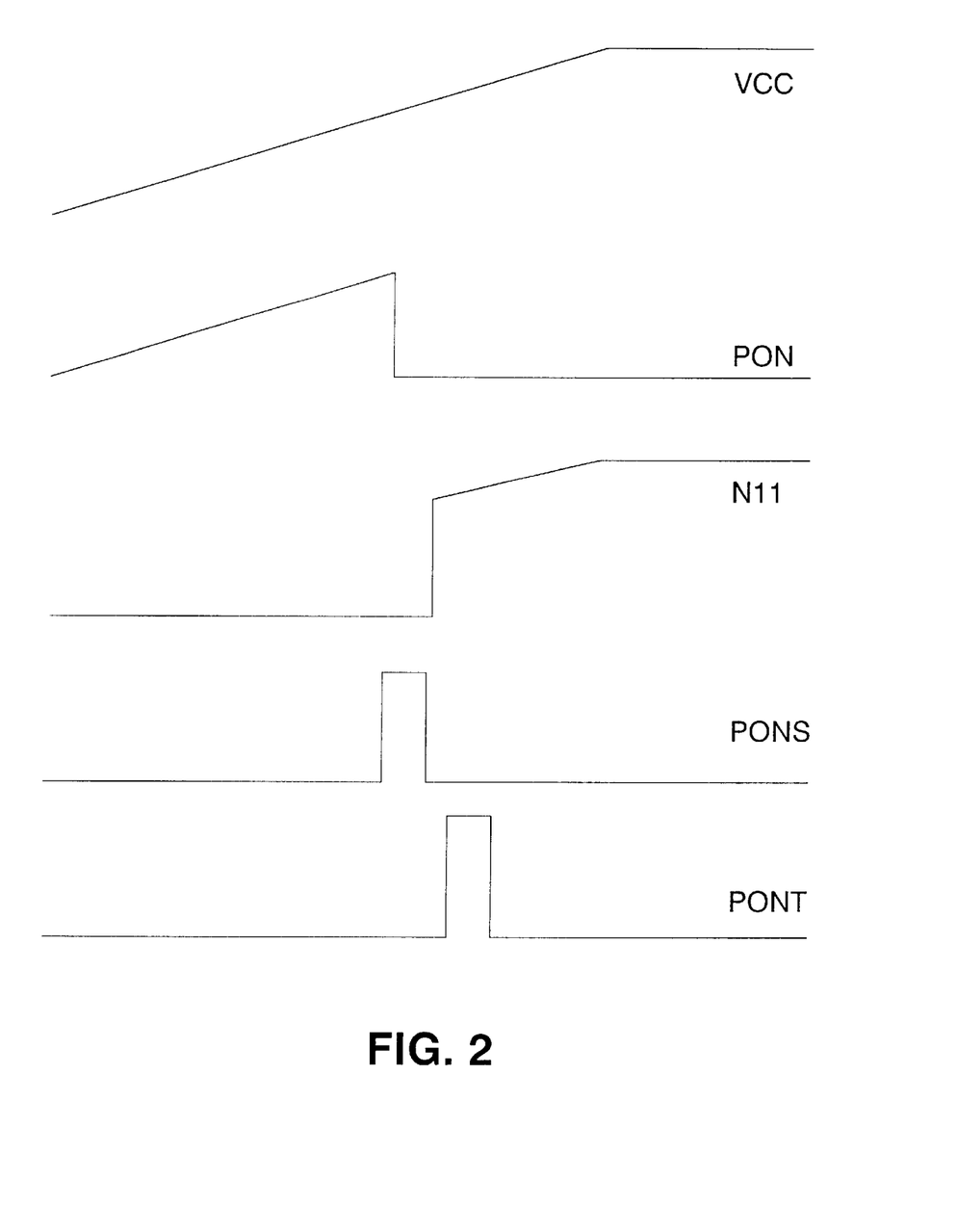
FIG. 2 is a timing diagram for illustrating the circuit operation of the power source circuit of the power-on circuit of FIG. 1.

FIG. 2 is a timing diagram for illustrating the operation as the power source circuit of the power-on circuit 10. As the power source is turned on and the voltage level of the power source voltage Vcc is increased gradually from 0 V (ground level), the voltage level of the power-on signal PON is increased to follow up with the voltage level of the power source voltage Vcc. If, with lapse of time, the voltage level of the power-on signal PON exceeds a certain threshold voltage level, it falls to the ground voltage level. A node N11 in the PONS generating circuit 12 rises from the ground voltage level to the power source voltage Vcc after a time interval as determined by a time delay of delay circuit unit (three cascaded NOT logical elements shown in the drawing). There is output a one-shot pulse PONS having a pulse width as determined by a delay value of the delay circuit unit, depending on the logic as determined by the node N11 and the signal PONS. There is output a one-shot pulse PONT after a time duration as determined by a delay time of delay circuit (unit four cascaded logical elements NOT in FIG. 1) as from an outputting of the one-shot pulse PONS. The circuitry for causing a direct current to flow at the time of resetting, such as, for example, a circuit 4, e.g., a fuse block circuit for resetting a fuse upon power source on, and a circuit 5, e.g., a fuse block circuit for resetting a fuse upon power source on, are reset by the one-shot pulses PONS and PONT. In the first embodiment, two one-shot pulses, namely the one-shot pulse PONS and the one-shot pulse PONT, are used for resetting. It is however apparent that the three or more one-shot pulses may also be used for resetting.

The above-described first embodiment resets a circuit, such as a fuse block, performing resetting indefinite nodal points, a plural number of times, so that resetting can be realized without flowing a large current in the circuit.

(Second Embodiment)

Figure 3:
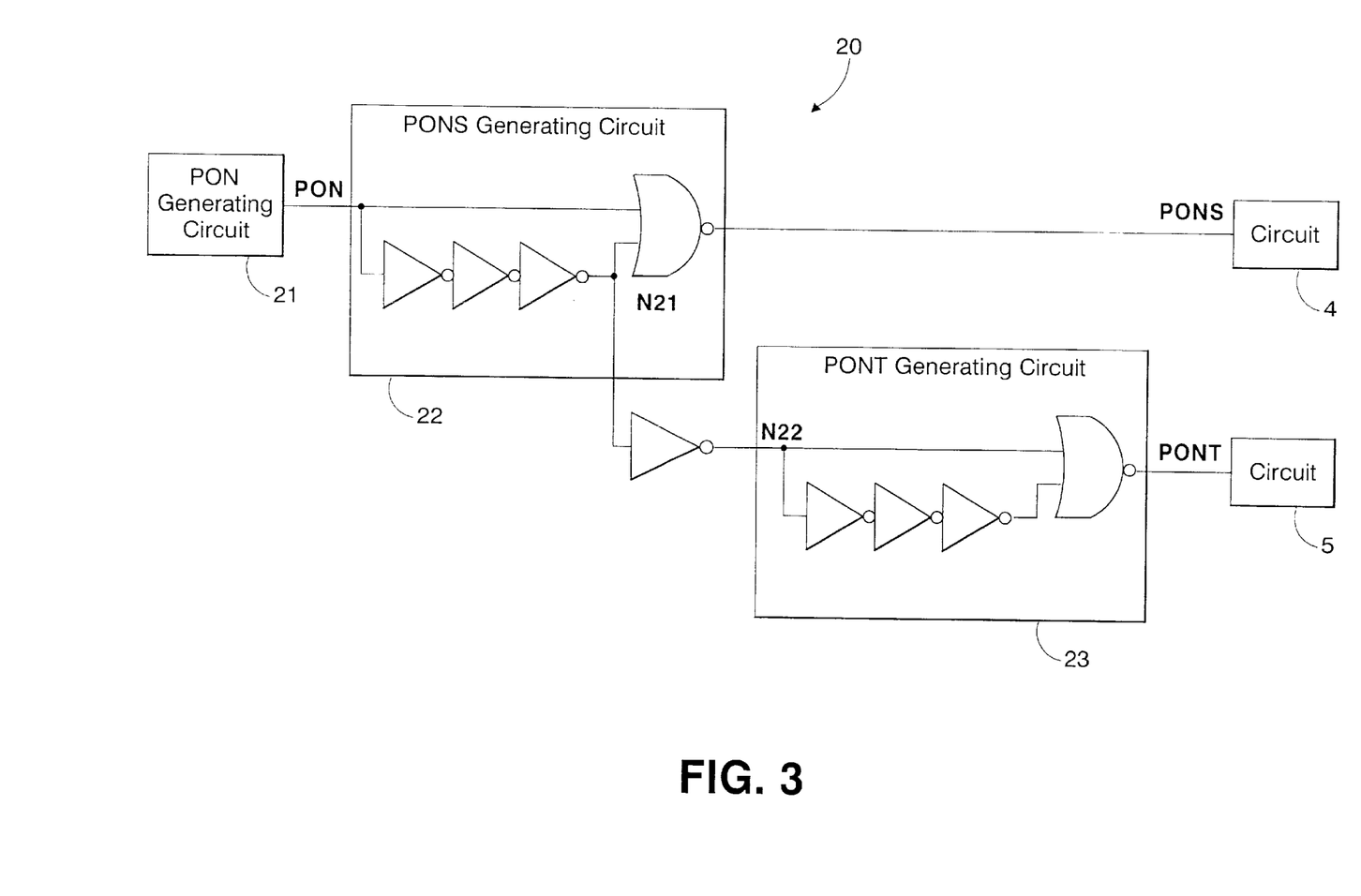
FIG. 3 is a circuit diagram for illustrating a power-on circuit according to a second embodiment of the present invention.

FIG. 3 is a circuit diagram for illustrating a second embodiment of a power-on circuit 20 according to the present invention. Referring to FIG. 3, the power-on circuit 20 of the second embodiment includes a PON generating circuit 21 for generating and outputting a power-on signal PON representing the voltage rising state following power-source-voltage-on, and a PONS generating circuit 22 for generating and outputting a one-shot pulse PONS from the power-on signal PON generated and output by the PON generating circuit 21. The power-on circuit 20 also includes a PONT generating circuit 23 for generating and outputting a one-shot pulse PONT from the one-shot pulse PONS generated and output from node N21 of the PONS generating circuit 21 via a NOT (inverter) element. The PONT generating circuit 23 has a configuration corresponding to PONS generating circuit 22.

Figure 4:
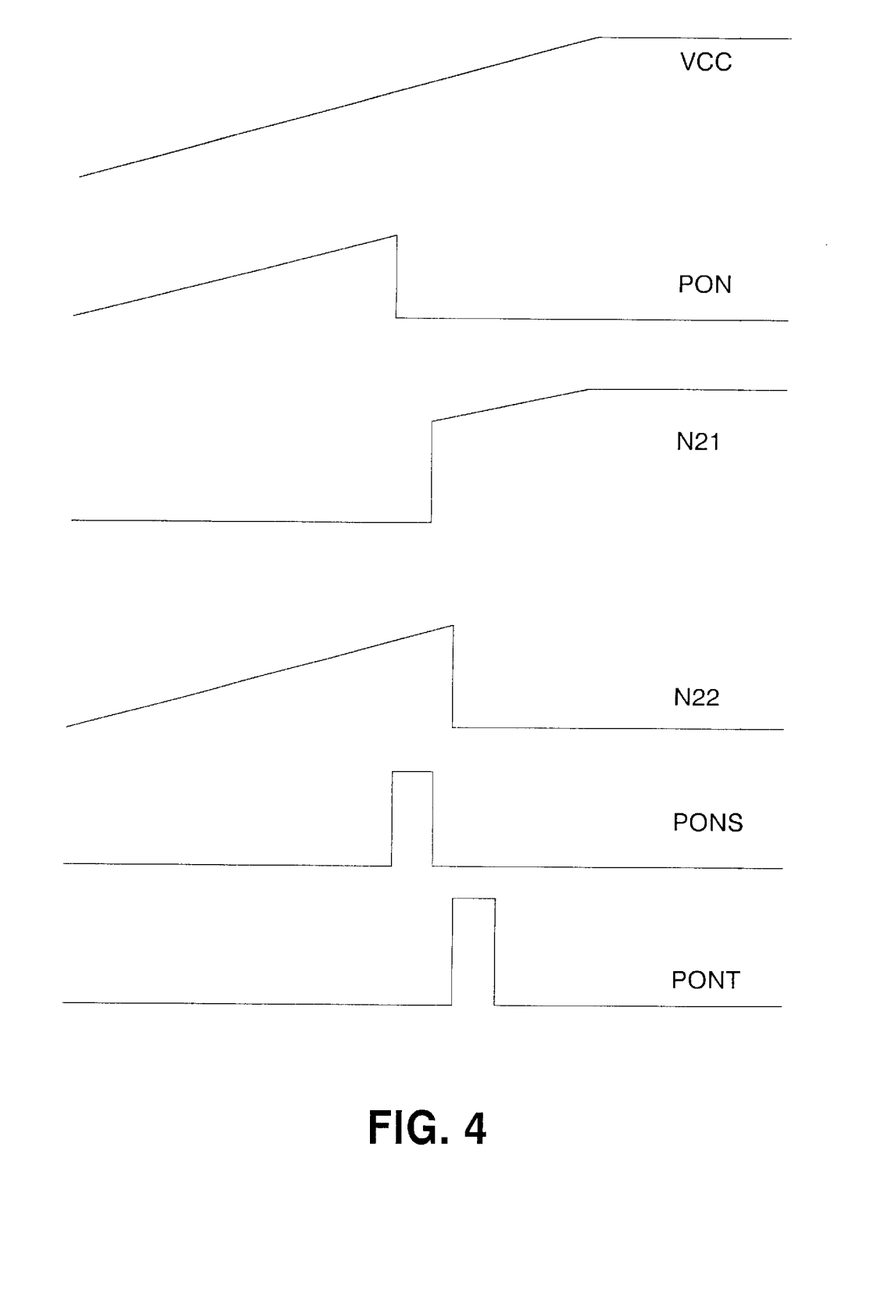
FIG. 4 is a timing diagram for illustrating the circuit operation of the power source circuit of the power-on circuit of FIG. 3.

FIG. 4 is a timing diagram for illustrating the operation as the power source circuit of the power-on circuit 20. As the power source is turned on and the voltage level of the power source voltage Vcc is increased gradually from 0 V, the voltage level of the power-on signal PON is increased to follow up with the voltage level of the power source voltage Vcc. If, with lapse of time, the voltage level of the power-on signal PON exceeds a certain threshold voltage level, it falls to the ground voltage level. A node N21 in the PONS generating circuit 22 rises from the ground voltage level to the power source voltage Vcc after a time as determined by a delay time of delay circuit unit as from the decay of the power-on signal PON. There is output the one-shot pulse PONS having a pulse width as determined by a delay value of delay circuit unit (circuitry comprised of three cascaded logical elements NOT in the drawing) depending on the logic as determined by the node N21 of the PONS generating circuit 22 and the power-on signal PON. The potential of a node N22 of the PONT generating circuit 23 falls down after a time delay of the delay circuit unit as from the rise of the potential of the node N21 in the PONS generating circuit 22. Since the waveform at the node N22 of the PONT generating circuit 23 corresponds to the waveform of the power-on signal PON delayed by the delay time of the delay circuit unit, and the PONT generating circuit 23 is the same circuit as the PONS generating circuit 22, a one-shot pulse PONT is output as from a time as determined by the delay time of the delay circuit means (a circuit comprised of three cascaded logical devices NOT in the drawing) from the output of the one-shot PONS. By the one-shot pulses PONS and PONT, the circuits 4 and 5 causing the direct current to flow at the time of resetting are reset. Although two one-shot pulses, namely the one-shot pulse PONS and the one-shot pulse PONT, are used for resetting in the first embodiment, it is however apparent that three or more one-shot pulses may also be used for resetting.

(Third Embodiment)

Figure 5:
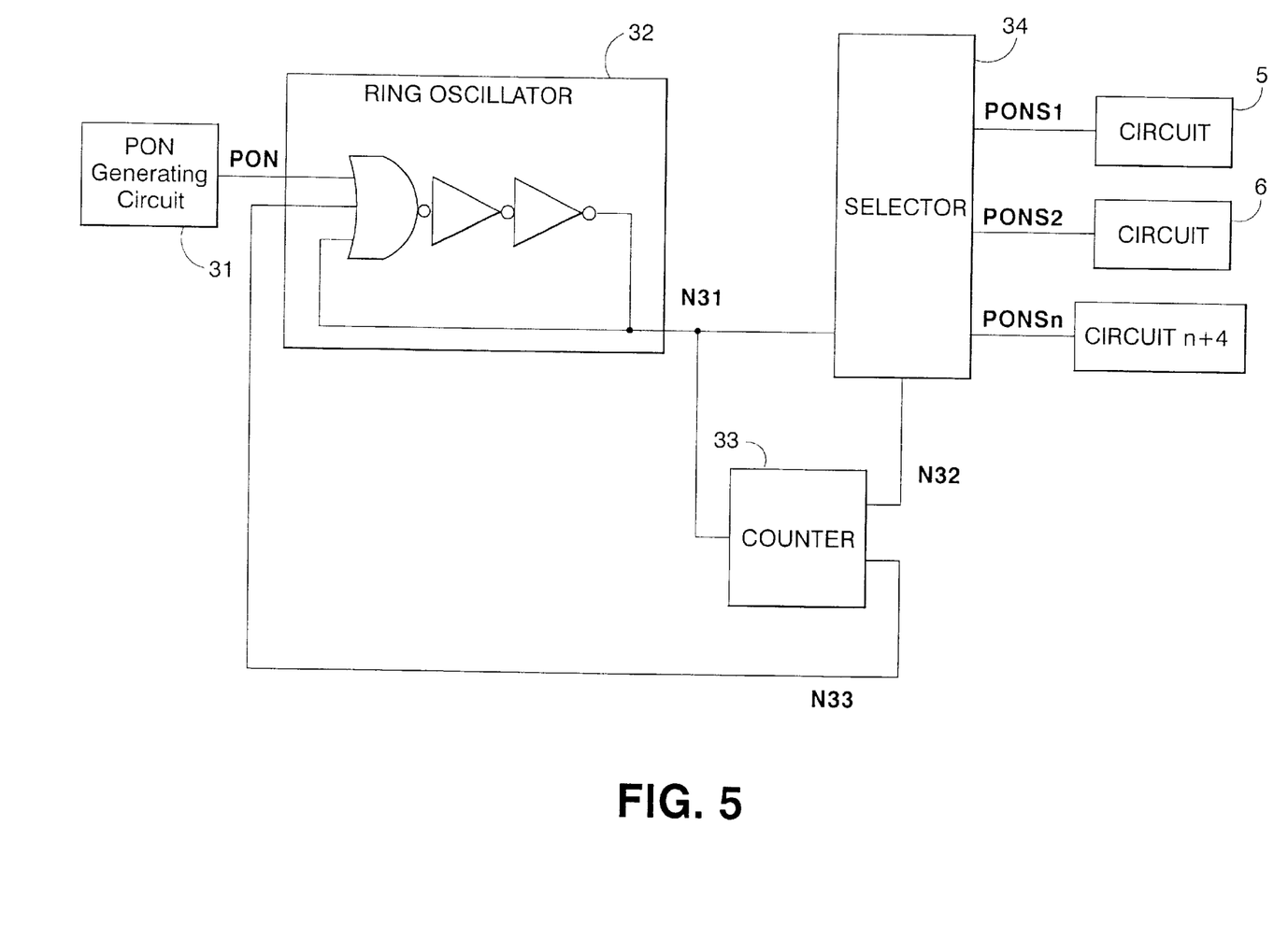
FIG. 5 is a circuit diagram for illustrating a power-on circuit according to a third embodiment of the present invention.

A third embodiment of the present invention is explained with reference to the drawings. FIG. 5 is a circuit diagram for illustrating the present third embodiment of a power-on circuit 30 according to the present invention. Referring to FIG. 5, a power-on circuit 30 of the third embodiment includes a PON generating circuit 31 for generating and outputting a power-on signal PON representing the voltage rising state following power-source-voltage-on, a ring oscillator 32 connected on the downstream side of the PON generating circuit 31, a counter 33 connected on the downstream side of the ring oscillator 32 and a selector 34 connected on the downstream side of the ring oscillator 32 in parallel with the counter 33. The counter 33 is connected with the selector via a bus N32, as well as with an input side of the ring oscillator via line N33.

Figure 6:
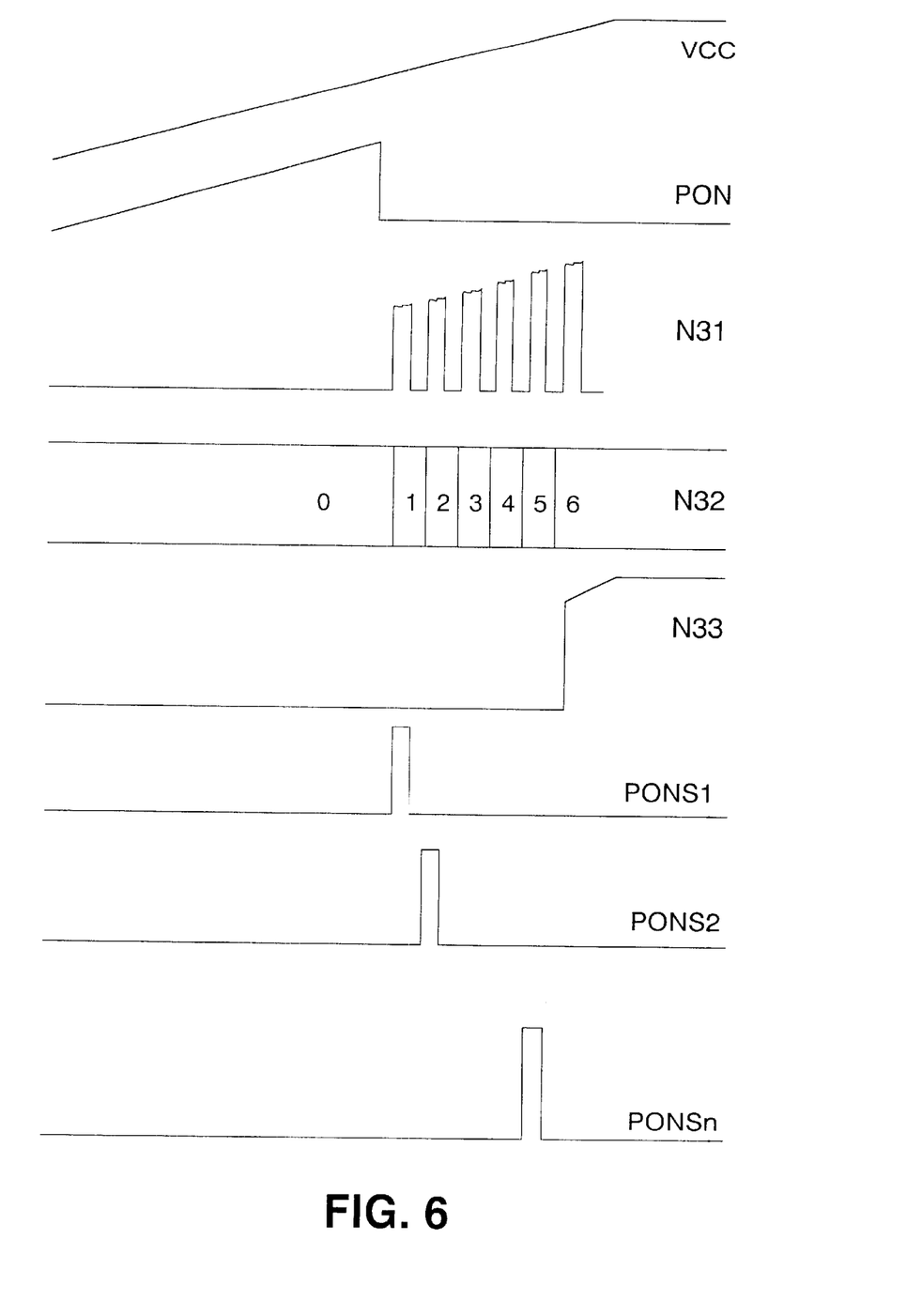
FIG. 6 is a timing diagram for illustrating the circuit operation of the power source circuit of the power-on circuit of FIG. 5.

FIG. 6 is a timing diagram for illustrating the operation as the power source circuit of the power-on circuit 30. As the power source is turned on and the voltage level of the power source voltage Vcc is increased gradually from 0 V, the voltage level of the power-on signal PON is increased to follow up with the voltage level of the power source voltage Vcc. If, with lapse of time, the voltage level of the power-on signal PON exceeds a certain threshold voltage level, it falls to the ground voltage level. As long as the potential of the power-on signal PON is increasing with the rise in the voltage level of the power source voltage Vcc, the ring oscillator 32 is halted. When the potential of the power-on signal PON falls to the ground voltage level, the ring oscillator 32 starts its operation, so that pulses start to be output to the node N31. Each time a pulse is output, the counter 33 counts it to route a count signal to a bus N32. At this time, the counter 33 is outputting a L-level as a ring oscillator stop signal line N33. A selector 34 distributes the pulses in the node N31 to one-shot pulses PONS1 to PONSn, depending on the value of the signal on the bus N32, to output one-shot pulses PONS1 to PONSn. It is noted that the pulse width of the one-shot pulses PONS1 to PONSn is equal to that of the pulses of the ring oscillator 32. After outputting the one-shot pulses PONSn, the counter 33 outputs a high-level pulse to the node N33 to halt the ring oscillator 32. The one-shot pulses PONS1 to PONSn reset the circuits 5, 6, . . . , (n+4) which cause the direct current to flow at the time of resetting. Although the ring oscillator 32 is halted here by the rise of the node N33, this function is, of course, inherently not necessary.

In the power-on circuit of the present third embodiment, the ring oscillator 32 is oscillated during voltage rise following power source on and the oscillation output is distributed to plural circuits 5, 6, . . . , n+4 to shift the timing of the plural circuits sequentially by way of resetting to prevent large current from flowing transiently in the circuit. The conventional technique disclosed in the JP Patent Kokai JP-A-6-290586 produces the operation of the oscillator after the steady power source voltage is reached, and has no structure of distributing the oscillation output of the oscillator, there lacking the concept of using plural internal circuits 3, with the target of the disclosed technique being to shorten the period as from the establishment of he steady voltage state until entrance to a normal cycle of operation, and thus differs in objective, structure, principle of operation and meritorious effect from the power-on circuit and the resetting circuit.

With the present third embodiment, described above, oscillations of the ring oscillator 32 are produced at the time of voltage increase following power source on and the oscillator output is distributed by the selector 34 to plural circuits 5, 6, . . . , n+4 to reset plural circuits with sequentially offset timings to prevent the large current from flowing transiently in the circuit. In the first embodiment, in which delay elements are provided for each of one-shot pulses PONSn, so that the power-on circuit of the first embodiment takes up a larger area for a larger number of the one-shot pulses PONSn. In the third embodiment, it is necessary to provide a selector and a counter separately, however, the number of delay elements necessary for generating the one-shot pulses PONS is 1/n, so that, for a larger value of n, the area occupied by the power-on circuit is diminished.

The present invention is not limited to the above-described embodiments, and may be applied to an optional resetting circuit or to a resetting method suited in carrying out the invention. The numbers, positions or shapes of the constituent members are not limited to those recited in the above-described embodiments, such that any suitable numbers, positions or shapes suited in carrying out the invention may be used. In the respective figures, the same numbers are used to depict the same components.

The meritorious effects of the present invention are summarized as follows.

In the above-described structure of the present invention, resetting of a circuit indefinite nodal points of which are reset, such as a fuse block, is carried out a plural number of times, so that resetting can be performed without allowing large current to flow in the circuit.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A power-on circuit in which resetting of a circuit designed to allow direct current to flow at the time of resetting is performed in a stable state without allowing a large current to flow in this circuit, comprising:
   a PON generating circuit generating and outputting a power-on signal representing an increasing voltage state following power source on;
   a ring oscillator arranged downstream of said PON generating circuit;
   a counter arranged downstream of said ring oscillator; and
   a selector arranged downstream of said ring oscillator in parallel with said counter;
   wherein for generating a plurality of one-shot pulses at the time of power on for use for circuit resetting, said ring oscillator generating said plural one-shot pulses, said counter and the selector are used,
   the number of the pulses generated by said ring oscillator being counted, and said selector distributing the one-shot pulses into n.

2. The power-on circuit as defined in claim 1
   wherein said ring oscillator is oscillated at the time of voltage increase following power source on to generate and output pulses.

3. The power-on circuit as defined in claim 1,
   wherein said selector distributes said one-shot pulses into n, and
   wherein the distributed one-shot pulses are imparted to a plurality of said circuits to permit said circuits to be reset sequentially with offset timings.

4. The power-on circuit as defined in claim 2,
   wherein said selector distributes said one-shot pulses into n, and
   wherein the distributed one-shot pulses are imparted to a plurality of said circuits to permit said circuits to be reset sequentially with offset timings.

5. A resetting method in which resetting of a circuit designed to allow direct current to flow at the time of resetting is performed in a stable state without allowing a large current to flow in this circuit, comprising:
   generating and outputting a power-on signal representing an increasing voltage state following power source on; and
   generating and outputting ring oscillator pulses responsive to said power-on signal;
   wherein in generating a plurality of one-shot pulses at the time of power on for use for resetting said circuit, the number of the ring oscillator pulses is counted and said one-shot pulses are distributed into n.

6. The resetting method as defined in claim 5
   wherein said ring oscillator pulses are generated and output at the time of voltage increase following power source on.

7. The resetting method as defined in claim 5,
   wherein said one-shot pulses distributed into n are imparted to a plurality of said circuits to permit said circuits to be reset sequentially with offset timings.

8. The resetting method as defined in claim 6,
   wherein said one-shot pulses distributed into n are imparted to a plurality of said circuits to permit said circuits to be reset sequentially with offset timings.

* * * * *